(12) United States Patent
Uchida et al.

(10) Patent No.: US 11,665,812 B2
(45) Date of Patent: May 30, 2023

(54) METAL MEMBER-EQUIPPED CIRCUIT BOARD, CIRCUIT ASSEMBLY, AND ELECTRICAL JUNCTION BOX

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Koki Uchida, Mie (JP); Yukinori Kita, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 17/652,149

(22) Filed: Feb. 23, 2022

(65) Prior Publication Data

US 2022/0183140 A1 Jun. 9, 2022

Related U.S. Application Data

(63) Continuation of application No. 16/605,082, filed as application No. PCT/JP2018/014201 on Apr. 3, 2018, now abandoned.

(30) Foreign Application Priority Data

Apr. 18, 2017 (JP) ................................ 2017-081746

(51) Int. Cl.
*H05K 1/02* (2006.01)
*H05K 7/20* (2006.01)

(52) U.S. Cl.
CPC .......... *H05K 1/0204* (2013.01); *H05K 7/205* (2013.01); *H05K 2201/10416* (2013.01)

(58) Field of Classification Search
CPC ................. H05K 1/0204; H05K 7/205; H05K 2201/10416
See application file for complete search history.

(56) References Cited

U.S. PATENT DOCUMENTS 5,581,443 A * 12/1996 Nakamura ............ G06F 1/1616
257/712
2012/0326292 A1* 12/2012 Ohashi ................ H01L 23/3677
257/690

FOREIGN PATENT DOCUMENTS

JP  2015-046479 A  3/2015
JP  2015-053786 A  3/2015

OTHER PUBLICATIONS

International Search Report, Application No. PCT/JP2018014201, dated Jul. 3, 2018. ISA/Japan Patent Office.

* cited by examiner

*Primary Examiner* — William H. Mayo, III
*Assistant Examiner* — Rhadames Alonzo Miller
(74) *Attorney, Agent, or Firm* — Honigman LLP (57) ABSTRACT

A metal member-equipped circuit board 21 includes: a printed circuit board 22 including a through hole 25; a metal member 30 including a shaft portion 31 that is inserted into the through hole 25, and a head portion 32 that is arranged outside the through hole 25, the head portion 32 having a diameter larger than a diameter A1 of the through hole 25, and a conductive bonding material 35 for bonding the shaft portion 31 and an inner wall of the through hole 25 to each other.

7 Claims, 13 Drawing Sheets

METAL MEMBER-EQUIPPED CIRCUIT BOARD, CIRCUIT ASSEMBLY, AND ELECTRICAL JUNCTION BOX

CROSS-REFERENCE TO RELATED APPLICATIONS

This application is a continuation of U.S. application Ser. No. 16/605,082 filed Oct. 14, 2019, which is a U.S. national stage of PCT/JP2018/014201 filed Apr. 3, 2018, which claims priority of Japanese Patent Application No. 2017-081746 filed on Apr. 18, 2017, which is incorporated herein by reference in its entirety.

TECHNICAL FIELD

The present specification discloses a technique related to a metal member-equipped circuit board.

BACKGROUND ART

A technique for attaching a metal member to a through hole in a circuit board is known. A circuit assembly disclosed in Patent Document 1 is provided with a printed circuit board in which a rectangular positioning through hole is formed, and a bus bar that is overlaid on this printed circuit board, and an inlay that is fixed to the bus bar is press-fitted into the positioning through hole in the printed circuit board.

CITATION LIST

Patent Documents

Patent Document 1: JP 2015-46479A

SUMMARY OF INVENTION

Technical Problem

According to the configuration disclosed in Patent Document 1, the inlay is press-fitted into the positioning through hole in the printed circuit board, and thus there is a problem in that high accuracy is required for dimensions of the inlay and the positioning through hole, and that manufacturing costs are likely to be high.

The technique disclosed in the present specification has been made in view of the above circumstances, and an object thereof is to reduce manufacturing costs of a metal member-equipped circuit board, a circuit assembly, and an electrical junction box.

Solution to Problem

A metal member-equipped circuit board disclosed in the present specification includes: a printed circuit board including a through hole; a metal member including a shaft portion that is inserted into the through hole, and a head portion that is arranged outside the through hole, the head portion having a diameter larger than a diameter of the through hole, and a conductive bonding material for bonding the shaft portion and an inner wall of the through hole to each other.

According to the above configuration, the shaft portion of the metal member and the inner wall of the through hole of the printed circuit board are bonded to each other with the conductive bonding material, and high dimensional accuracy is not necessarily required compared to a configuration, for example, in which the shaft portion of the metal member and the inner wall of the through hole of the printed circuit board are joined only by press-fitting. Thus it is possible to reduce manufacturing costs.

Furthermore, it is possible to readily perform positioning of the shaft portion of the metal member in the direction in which the shaft portion is inserted into the through hole, because the head portion of the metal member that has a diameter larger than the diameter of the through hole is arranged outside the through hole in the circuit board. Furthermore, due to the metal member having the head portion, heat capacity of the metal member can be increased compared to a metal member having no head portion, making it possible to increase heat dissipation performance via the metal member.

The following aspects are preferable as the embodiments of the technique disclosed in the present specification.

In a state where the shaft portion has been inserted into the through hole, an end face of the shaft portion on the opposite side of the head portion may also be formed at the same height as a surface of a conductive path on which an electric component of the printed circuit board is mounted.

With this configuration, a level difference between the face on which the electric component is mounted in the conductive path of the circuit board and the end face of the shaft portion is suppressed, and thus the electric component is not likely to be inclined on the printed circuit board, making it possible to reduce defective mounting of the electric component.

The bonding material may also bond a face of the printed circuit board that is opposed to the head portion and the head portion of the metal member to each other.

With this configuration, the contact area of the bonding material becomes larger, and thus it is possible to reduce electric resistance while enhancing bonding strength between the circuit board and the metal member.

An outer circumference of the shaft portion may also include a press-fitting portion that is press-fitted into the hole wall of the through hole, and a non-press-fitting portion that faces the hole wall of the through hole and that is not press-fitted into the hole wall.

With this configuration, due to the outer circumference of the shaft portion having a press-fitting portion that is press-fitted into the hole wall of the through hole, the shaft portion can be engaged in the hole wall of the through hole at the time of attaching the metal member, and thus the work for bonding using the bonding material can be readily performed, making it possible to reduce manufacturing costs. Furthermore, due to the outer circumference of the shaft portion having the non-press-fitting portion, high dimensional accuracy is not required compared to a configuration in which the whole outer circumferential face of the shaft portion is press-fitted into the hole wall of the through hole, and thus manufacturing costs can be reduced.

A circuit assembly may also include the metal member-equipped circuit board, an electric component connected to an end face of the shaft portion that is on the opposite side of the head portion, a heat dissipation member placed on the metal member-equipped circuit board, and a spacer portion that keeps a space between the printed circuit board and the heat dissipation member.

With this configuration, it is possible to dissipate heat in the electric component with the heat dissipation member, and due to the spacer portion, it is possible to suitably perform positioning of the insertion depth of the shaft portion of the metal member relative to the through hole in the circuit board.

The spacer portion may also be provided in one piece with the heat dissipation member.

With this configuration, it is possible to reduce the number of parts compared to the case where the spacer portion is provided separately from the heat dissipation member.

An electrical junction box may also include the metal member-equipped circuit board, and a case configured to cover the metal member-equipped circuit board.

Advantageous Effects of Invention

According to the technique disclosed in the present specification, it is possible to reduce manufacturing costs of a metal member-equipped circuit board, a circuit assembly, and an electrical junction box.

DESCRIPTION OF EMBODIMENTS

First Embodiment

Hereinafter, a first embodiment will be described with reference to FIGS. 1 to 6.

An electrical junction box 10 is, for example, arranged in an electric power supply path between a power source such as a vehicle battery and loads constituted by in-vehicle electric components such as a lamp, a wiper, and the like, or a motor and the like, and can be used in a DC-DC converter, an inverter, and the like. Although this electrical junction box 10 can be arranged in any orientation, for the sake of simplifying the description, the following description will be given assuming that the X direction shown in FIG. 3 corresponds to the front direction, the Y direction shown in FIG. 1 corresponds to the left direction, and the Z direction shown in FIG. 1 corresponds to the upper direction.

Electrical Junction Box 10

Figure 1:
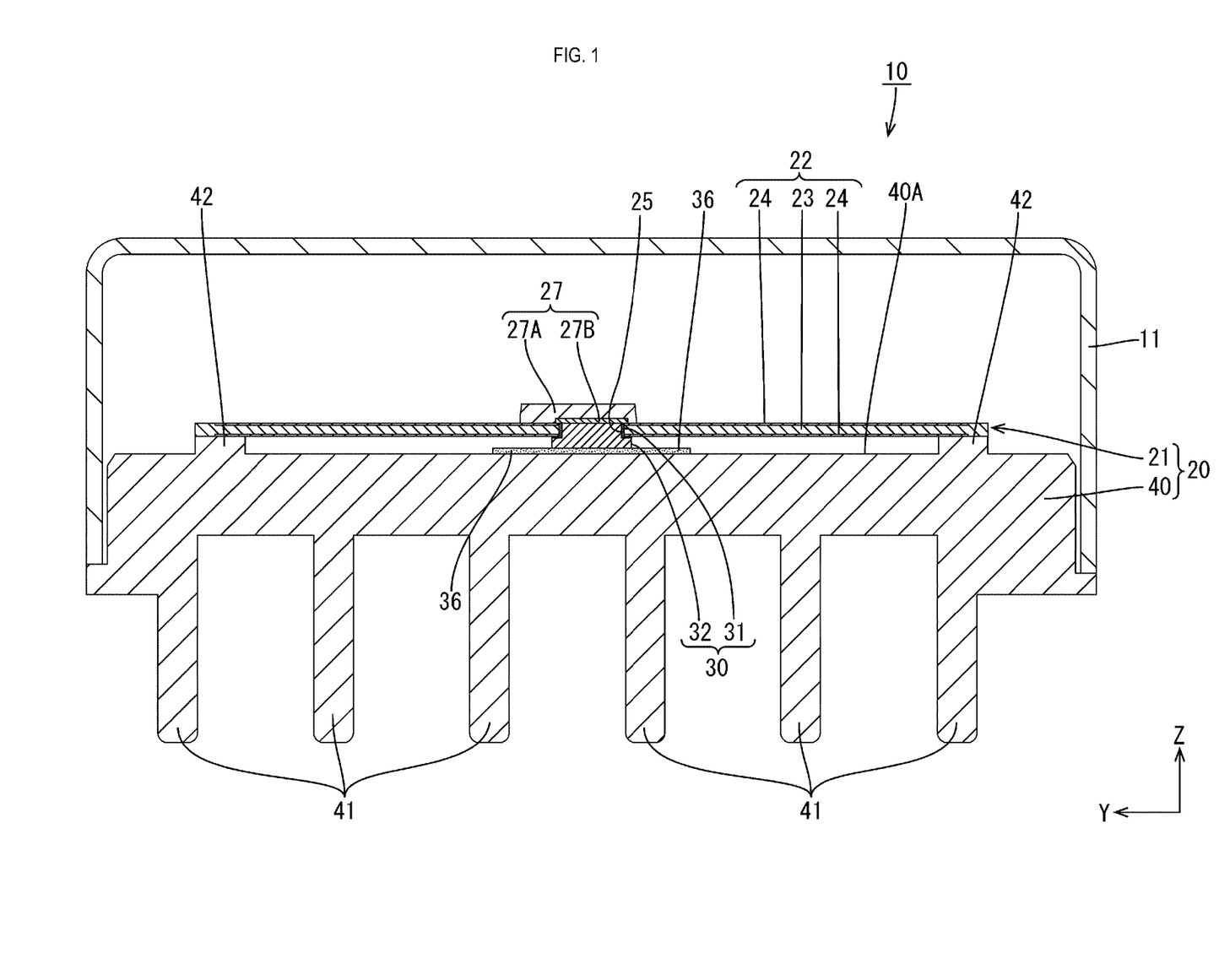
FIG. 1 is a cross-sectional view showing an electrical junction box according to a first embodiment.

As shown in FIG. 1, the electrical junction box 10 includes a circuit assembly 20 and a case 11 for covering the circuit assembly 20. The case 11 is shaped like a box that is open downward, and made of metal such as aluminum or an aluminum alloy, or a synthetic resin.

Circuit Assembly 20

The circuit assembly 20 includes a metal member-equipped circuit board 21, and a heat dissipation member 40 that is arranged below the metal member-equipped circuit board 21 and configured to dissipate heat in the metal member-equipped circuit board 21 to the outside.

Metal Member-Equipped Circuit Board 21

The metal member-equipped circuit board 21 includes a printed circuit board 22, and a metal member 30 that is attached to a through hole 25 of the printed circuit board 22.

Printed Circuit Board 22

The printed circuit board 22 is a thick copper circuit board that includes thick conductive paths 24, and a comparatively large current can flow in the conductive paths 24. The conductive paths 24, which are made of metal such as copper, are formed on the upper and lower faces of an insulative plate 23 formed by an insulative material, by printed wiring. The through hole 25 passes through the printed circuit board 22 in the vertical direction (thickness direction). Although the through hole 25 is shaped in a perfect circle in the present embodiment, the shape of the through hole 25 is not limited to this, and may also be ellipsoidal, oval, polygonal, or the like. Note, that although a conductive path is not formed on the hole wall of the through hole 25, and the conductive paths 24 on the upper and lower faces of the printed circuit board 22 are electrically connected with each other via the later-described conductive bonding material 35 in the present embodiment, there is no limitation to this. A configuration is also possible, for example, in which a conductive path is formed on the entire hole wall of the through hole 25 using a silver foil or the like, such that the conductive paths 24 on the upper and lower faces of the printed circuit board 22 are electrically connected with each other via the conductive path on the hole wall of the through hole 25.

Figure 3:
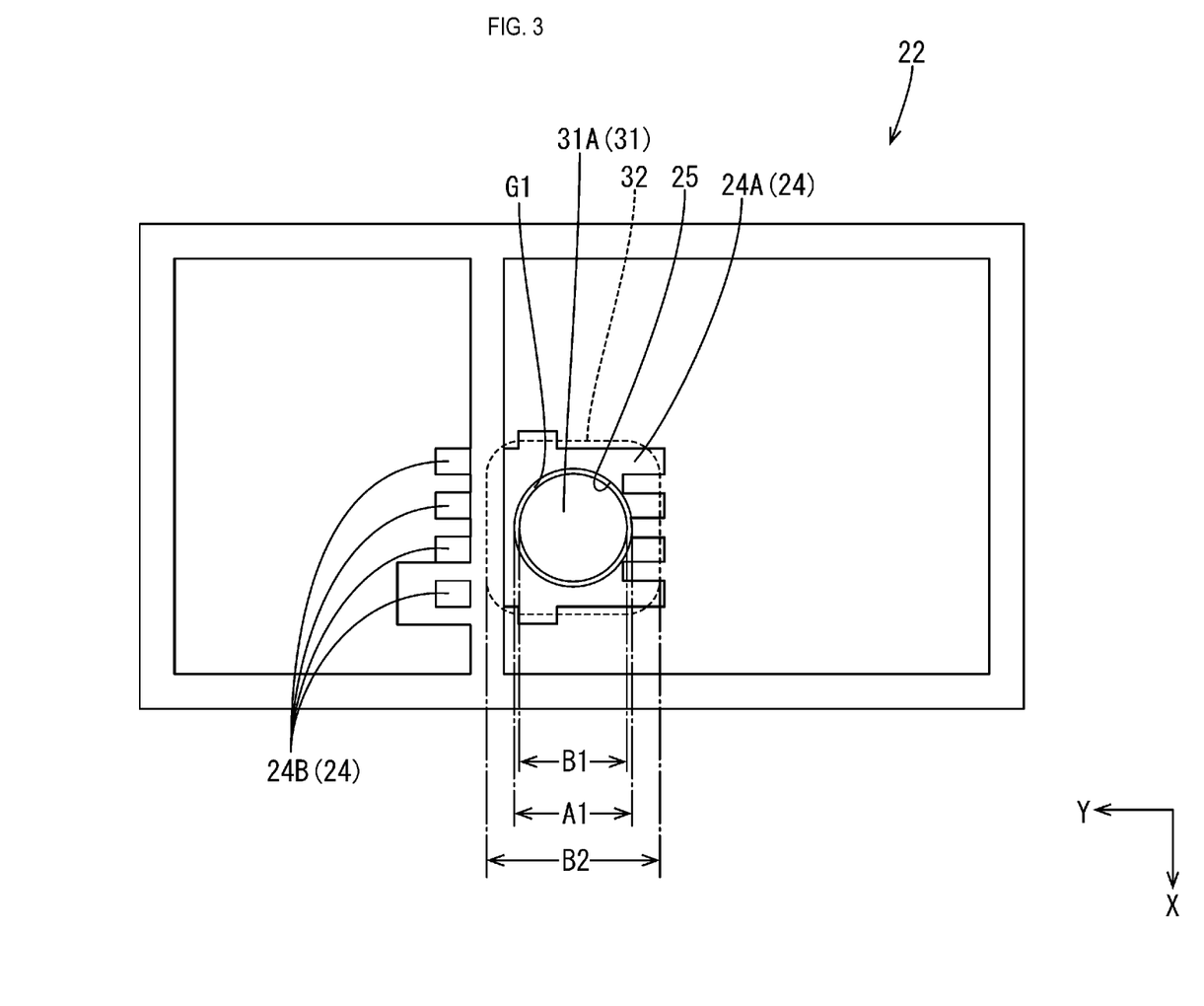
FIG. 3 is a plan view showing a state where a shaft portion of a metal member has been inserted into a through hole of a circuit board.

An electric component 27 serving as a heat-generating component is mounted in one of the conductive paths 24 of the printed circuit board 22 and the metal member 30. The electric component 27 includes a main body 27A shaped in a flat cuboid, and a plurality of terminals 27B formed on the bottom face of the main body 27A. The lower faces of the plurality of terminals 27B are arranged on the same plane, and connected with a plurality of lands serving as the conductive paths 24 formed on a surface of the printed circuit board 22. As shown in FIG. 3, the conductive paths 24 (lands) connected to the terminals 27B of the electric component 27 includes a land 24A (24) provided in a rectangular region that substantially surrounds the circuit board through hole 25, and a plurality of lands 24B (24) arranged in a row at a position spaced apart from the aforementioned region. The plurality of terminals 27B of the electric component 27 in the present embodiment are soldered to the conductive paths 24 (lands 24A, 24B) on the upper face of the printed circuit board 22 and to the upper face 31A of the metal member 30. Although the electric component 27 is a FET (Field Effect Transistor) in the present embodiment, the electric component 27 may also be a register such as a shunt resistor, a heat generating component such as a coil, a capacitor, or the like.

Metal Member 30

Figure 4:
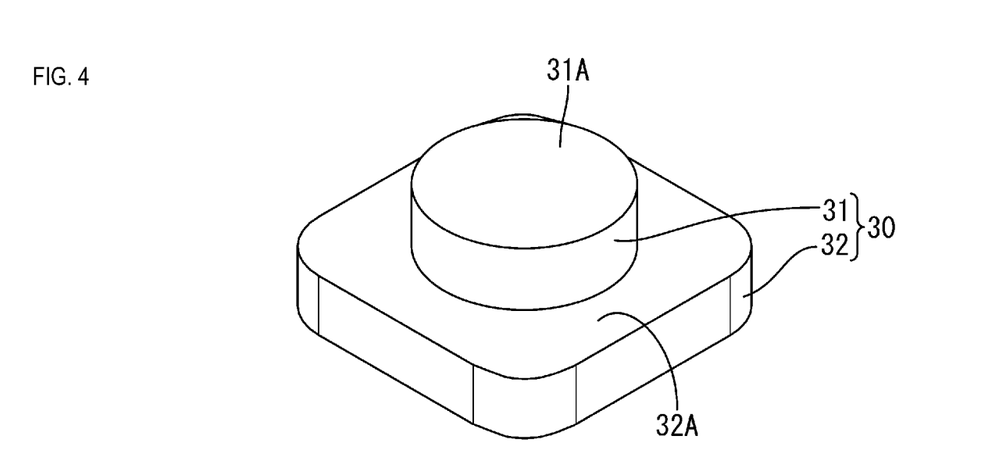
FIG. 4 is a perspective view showing the metal member.
Figure 5:
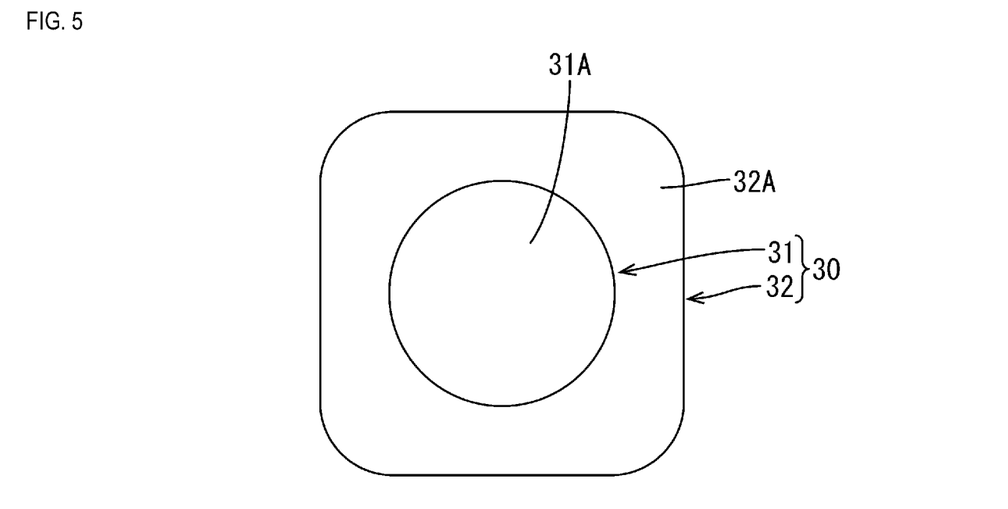
FIG. 5 is a plan view showing the metal member.
Figure 6:
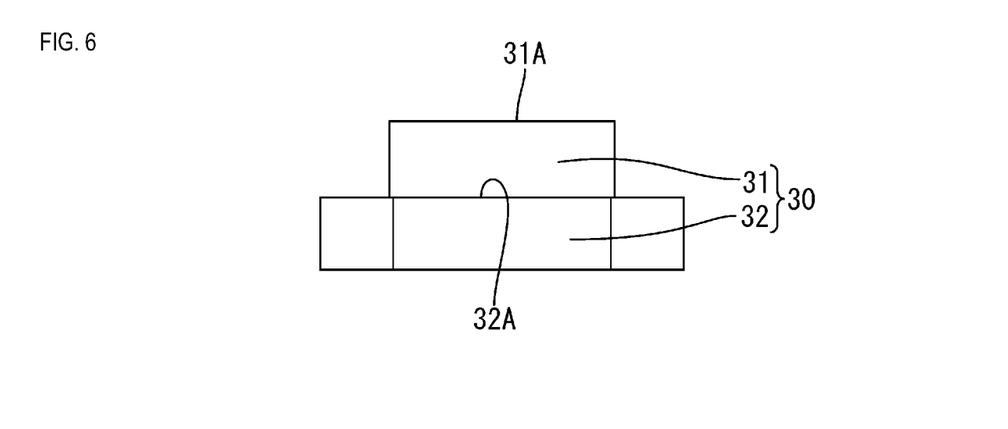
FIG. 6 is a side view showing the metal member.

The metal member 30 is made of metal such as copper, a copper alloy, aluminum, an aluminum alloy, steel, or stainless steel. As shown in FIGS. 4 and 5, the metal member 30 includes a cylindrical shaft portion 31 that is inserted into the through hole 25, and a prismatic head portion 32 that protrudes from the shaft portion 31 in a step-like manner. In the present embodiment, a rivet is used as the metal member 30. As shown in FIG. 3, the shaft portion 31 has a flat cross section shaped in a perfect circle, and has a diameter B1 that is smaller than a diameter A1 of the through hole 25. When the shaft portion 31 is inserted into the through hole 25, a gap G1 into which a solder serving as a bonding material 35 can be placed is formed between an outer circumferential face of the shaft portion 31 and the hole wall of the through hole 25.

Figure 2:
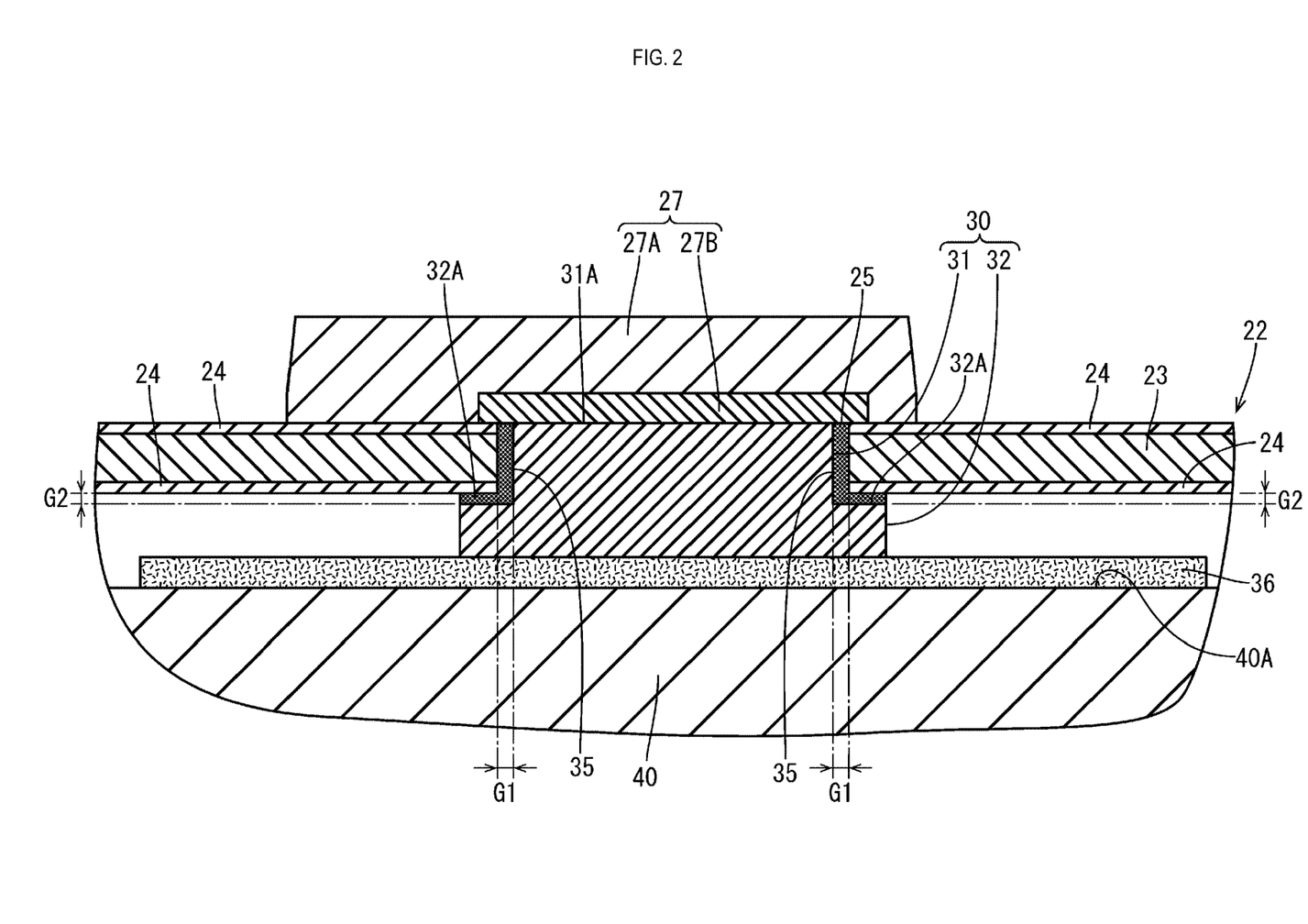
FIG. 2 is a partial enlarged view of FIG. 1.

As shown in FIG. 2, the length of the shaft portion 31 in the vertical direction (axial direction) is larger than the thickness of the printed circuit board 22 by a dimension of a gap G2 (thickness of the bonding material 35). For example, after inserting the shaft portion 31 into the through hole 25 to reach a predetermined position (position shown in FIG. 2) in a state where the bonding material 35 made of a solder paste or the like is applied to the region of the through hole 25 in the lower face of the printed circuit board 22, the bonding material 35 is filled into the gap G1 between the shaft portion 31 and the hole wall of the through hole 25 and the gap G2 between the printed circuit board 22 and the head portion 32, and thus the printed circuit board 22 and the metal member 30 can be bonded to each other. In the state where the metal member 30 is bonded to the printed circuit board 22 with the bonding material 35, an upper end face 31A of the shaft portion 31 is at the same height as (level with) the upper face of the conductive path 24 on the upper face of the printed circuit board 22. The head portion 32 is shaped in a rectangular plate, and as shown in FIG. 3, the minimum diameter B2 passing through the central axis of the head portion 32 is larger than the hole diameter A1 of the through hole 25. As shown in FIG. 2 the gap G2 between the upper face 32A of the head portion 32 and the lower face of the printed circuit board 22, and the gap G1 between the outer circumferential face of the shaft portion 31 and the hole wall of the through hole 25, are filled with the bonding material 35.

A heat conductive material 36 is arranged between the lower face of the head portion 32 and the upper face 40A of the heat dissipation member 40. A material having high heat conductivity and insulation property, such as silicone grease, is used as the heat conductive material 36. The heat conductive material 36 is arranged in close contact with the entire lower face of the head portion 32 and the upper face 40A of the heat dissipation member 40. Accordingly, heat in the metal member 30 is transferred to the heat dissipation member 40 via the heat conductive material 36, and is dissipated from the heat dissipation member 40 to the exterior.

Heat Dissipation Member 40

The heat dissipation member 40 is made of metal having high heat conductivity, such as aluminum, or an aluminum alloy, and as shown in FIG. 1, includes a flat upper face 40A, and a plurality of heat dissipation fins 41 arranged in a row on the lower surface in a comb-like manner. A plurality of spacer portions 42 protruding upward are provided on the upper surface 40A of the heat dissipation member 40. The plurality of spacer portions 42 are provided near the circumferential edge portion on the upper face of the heat dissipation member 40. By placing the outer circumferential edge portion of the printed circuit board 22 thereon to support the printed circuit board 22, a predetermined gap (whose dimension obtained by adding the thickness of the head portion 32 to the thickness of the heat conductive material 36) is kept between the lower face of the printed circuit board 22 and the upper face 40A of the heat dissipation member 40. Note, that if the conductive path 24 is formed on the lower face of the printed circuit board 22 that comes in contact with the spacer portions 42, the insulation layer formed of an insulative adhesive agent or the like is formed on the upper face of the spacer portions 42 and insulates the printed circuit board 22 from the spacer portions 42. The circuit assembly 20 is formed by fixing the heat dissipation member 40 and the metal member-equipped circuit board 21 to each other with a fixing means such as a screw (not shown), and an electrical junction box 10 (FIG. 1) is formed by covering the circuit assembly 20 with the case 11.

According to the present embodiment, the following operation and effects are achieved.

The metal member-equipped circuit board 21 includes: the printed circuit board 22 having the through hole 25, the metal member 30 having the shaft portion 31 that is inserted into the through hole 25, and the head portion 32 having the diameter B2 that is larger than the diameter A1 of the through hole 25 and arranged outside the through hole 25, and the conductive bonding material 35 that bonds the shaft portion 31 and the inner wall of the through hole 25 to each other.

According to the present embodiment, since the shaft portion 31 of the metal member 30 and the inner wall of the through hole 25 of the printed circuit board 22 are bonded to each other with the conductive bonding material 35, high dimensional accuracy is not necessarily required compared to a configuration, for example, in which the shaft portion 31 of the metal member 30 and the inner wall of the through hole 25 of the printed circuit board 22 are joined with each other only by press-fitting, and thus manufacturing costs can be reduced. Furthermore, since the metal member 30 includes the head portion 32, which has a diameter B2 that is larger than the hole diameter A1 of the through hole 25, it is possible to readily perform positioning of the shaft portion 31 in the direction in which the shaft portion 31 is inserted into the through hole 25. Moreover, since the metal member 30 includes the head portion 32, the heat capacity of the metal member 30 can be enhanced compared to a case in which the head portion 32 is not provided, making it possible to enhance heat dissipation performance.

Furthermore, in a state where the shaft portion 31 has been inserted into the through hole 25, the upper end face 31A of the shaft portion 31 (end face on the opposite side of the head portion 32) is formed at the same height as the surface of the conductive path 24 of the printed circuit board 22 on which the electric component 27 is mounted.

With this configuration, the level difference between the conductive path 24 of the printed circuit board 22 and the end face 31A of the shaft portion 31 is suppressed, and the electric component 27 is not likely to be inclined on the printed circuit board 22, and thus it is possible to reduce defective mounting of the electric component 27.

The bonding material 35 bonds a face of the printed circuit board 22 that is opposed to the head portion 32 and the head portion 32 of the metal member 30 to each other.

With this configuration, since the contact area of the bonding material 35 becomes large, the electrical resistance can be reduced while enhancing the fixing strength between the printed circuit board 22 and the metal member 30.

Furthermore, the conductive path 24 of the lower face of the printed circuit board 22 (face opposed to the head portion 32) and the head portion 32 can be electrically bonded to each other with the bonding material 35.

Furthermore, the circuit assembly 20 includes: the metal member-equipped circuit board 21, the electric component 27 connected to the upper end face 31A of the shaft portion 31 (end face on the opposite side of the head portion 32), and the heat dissipation member 40 that can be placed on the metal member-equipped circuit board 21, and the spacer portions 42 that keep the space between the printed circuit board 22 and the heat dissipation member 40.

With this configuration, heat in the electric component 27 can be dissipated by the heat dissipation member 40, and due to the spacer portions 42, positioning of the shaft portion 31 of the metal member 30 relative to the depth of insertion into the through hole 25 can be suitably performed.

Furthermore, the spacer portions 42 are provided in one piece with the heat dissipation member 40.

With this configuration, the number of parts can be reduced compared to the case where the spacer portions 42 are provided separately from the heat dissipation member 40.

Second Embodiment

Next, a second embodiment will be described with reference to FIGS. 7 to 10. Whereas the head portion 32 of the metal member 30 is rectangular in the first embodiment, as shown in FIG. 8, a head portion 52 of a metal member 50 is circular in the second embodiment. Other structural aspects are the same as in the first embodiment, and therefore the same structures as in the first embodiment are denoted with the same reference signs, and the description thereof is omitted.

Figure 7:
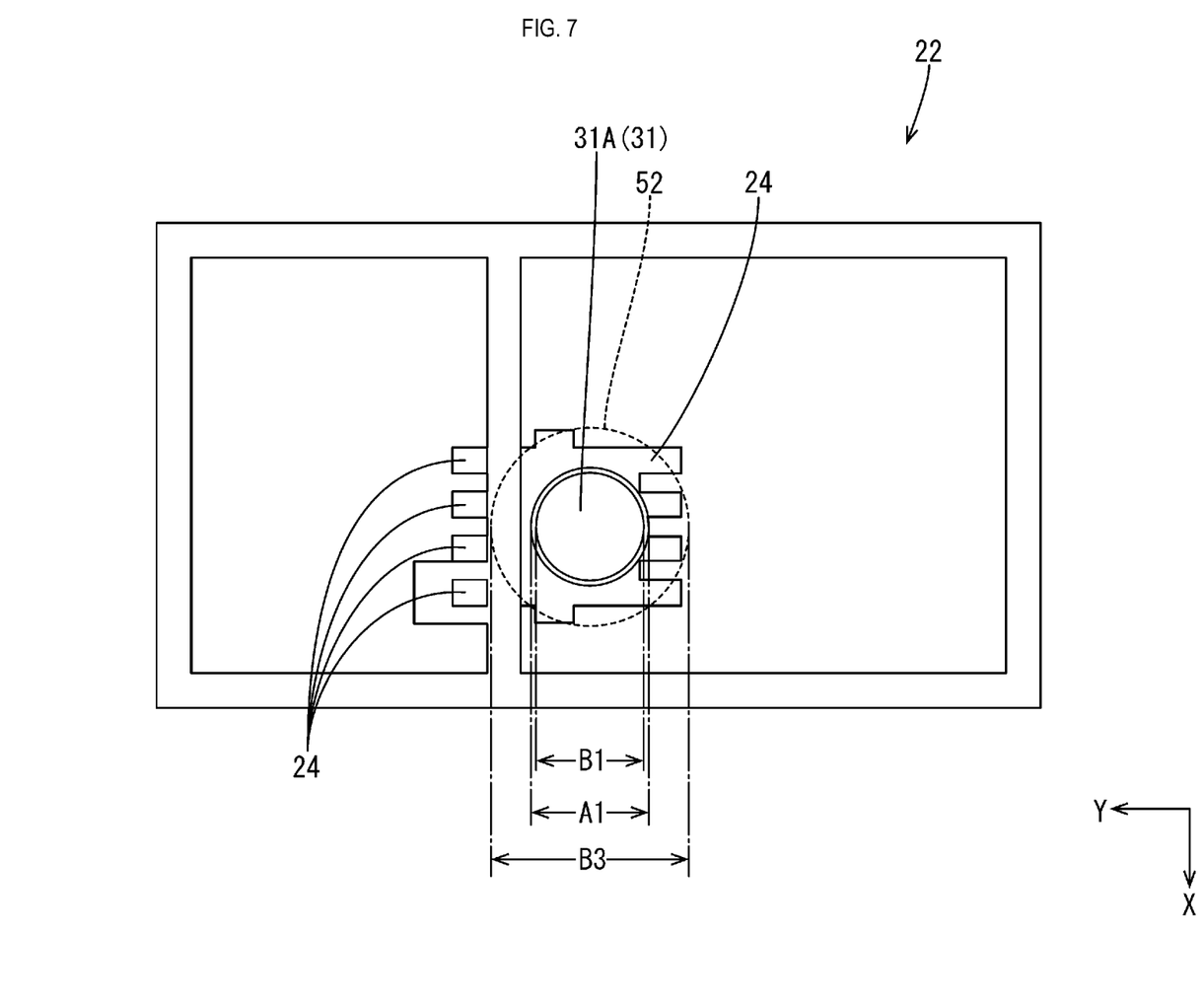
FIG. 7 is a plan view showing a state where a shaft portion of a metal member according to a second embodiment has been inserted into the through hole of the printed circuit board.
Figure 8:
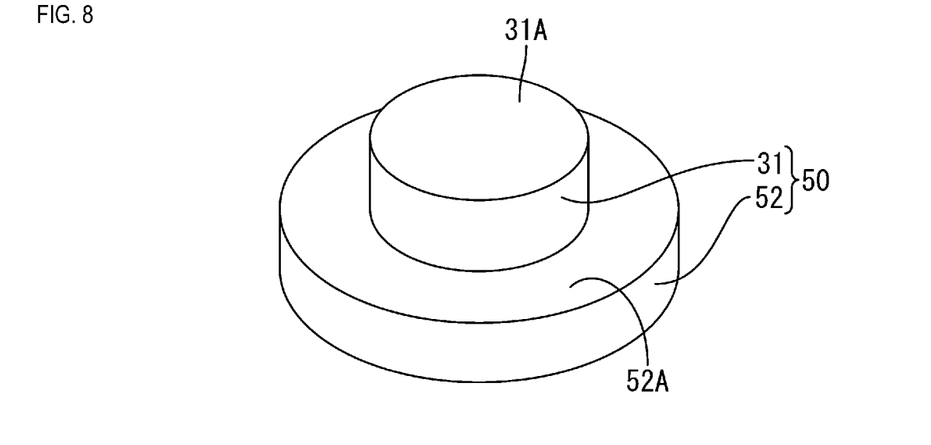
FIG. 8 is a perspective view showing the metal member.
Figure 9:
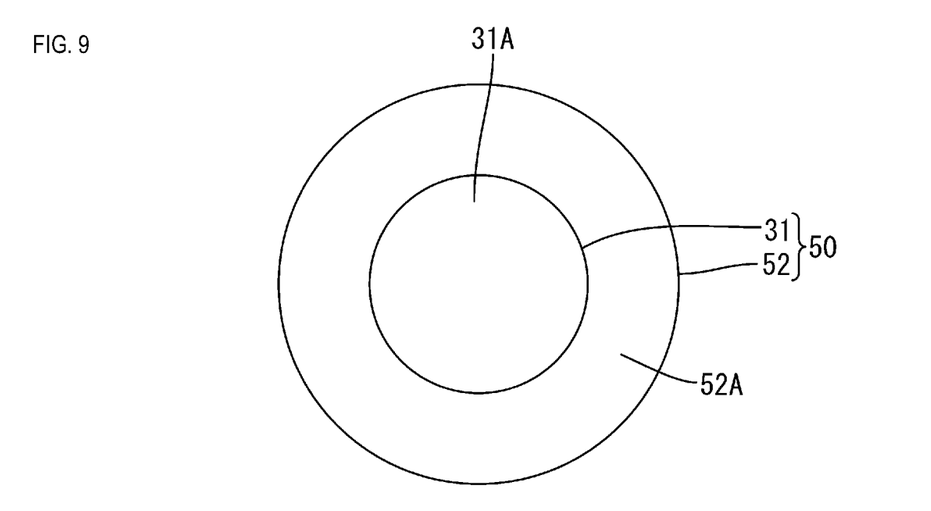
FIG. 9 is a plan view showing the metal member.
Figure 10:
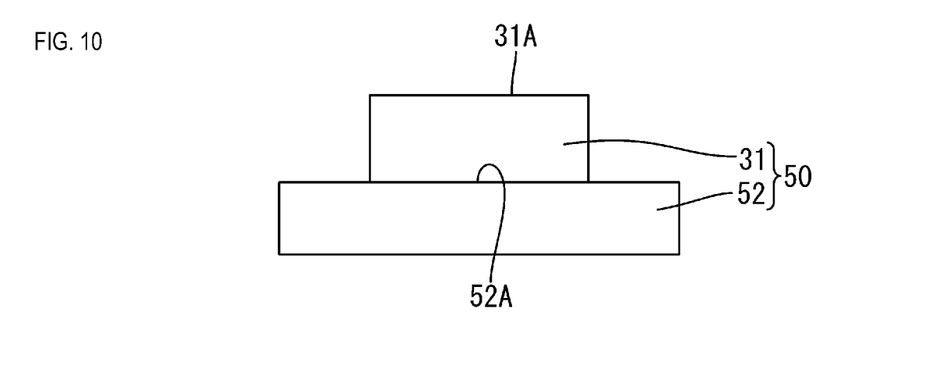
FIG. 10 is a side view showing the metal member.

As shown in FIG. 7, a diameter B3 of a head portion 52 that is shaped like a circular disc and that is arranged below the through hole 25 of the printed circuit board 22 is larger than the diameter A1 of the through hole 25. The gap between the through hole 25 of the printed circuit board 22 and the shaft portion 31 is filled with the conductive bonding material 35, and the gap between the lower face of the printed circuit board 22 and the upper face 52A of the head portion 52 is also filled with the conductive bonding material 35.

Third Embodiment

Next, a third embodiment will be described with reference to FIGS. 11 to 14. Whereas in the above embodiments the flat cross-section of the shaft portion 31 of the metal member 30 is shaped in a perfect circle, a shaft portion 61 of a metal member 60 is not shaped in a circle in the third embodiment. Other structural aspects are the same as in the above embodiments, and therefore the same structures as in the above embodiments are denoted with the same reference signs, and the description thereof is omitted.

Figure 11:
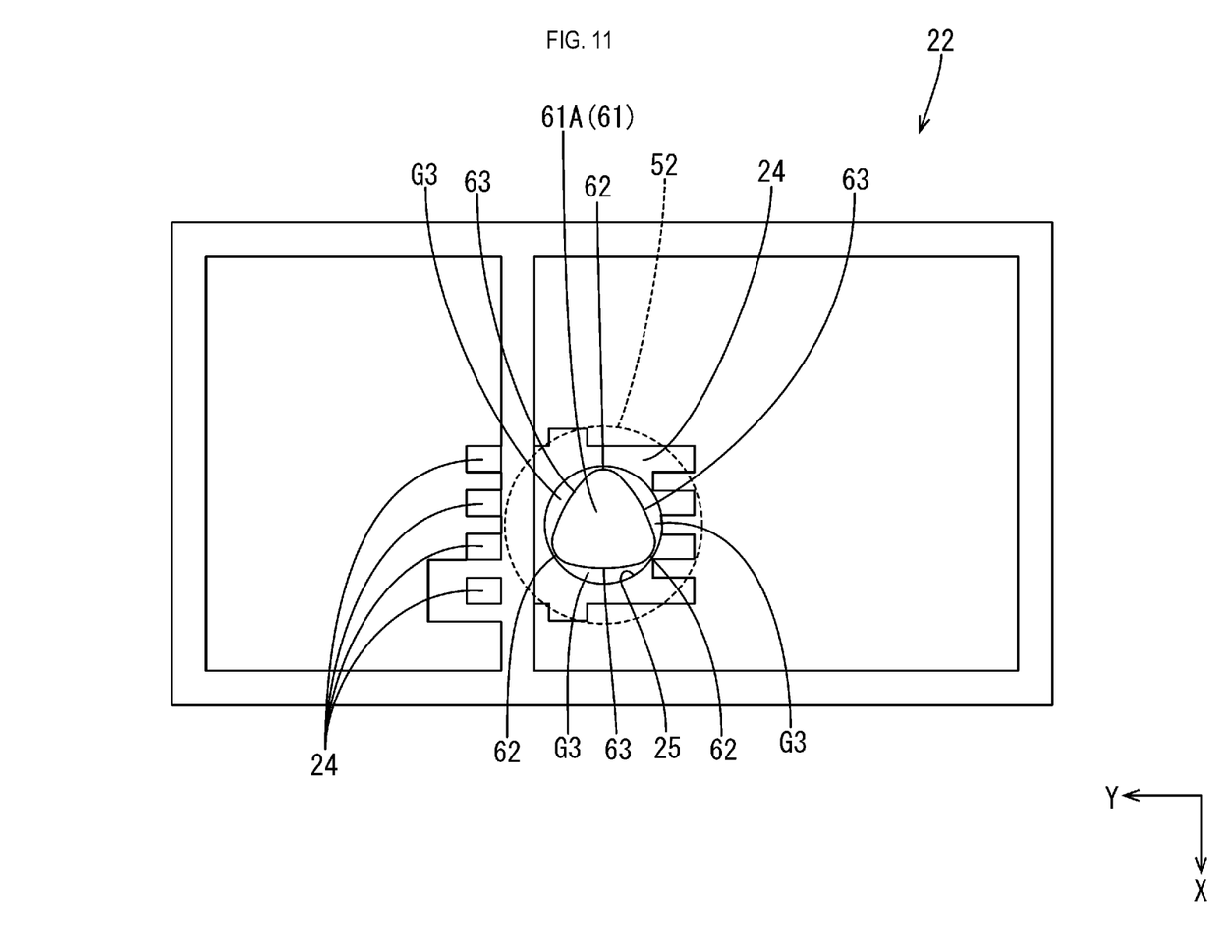
FIG. 11 is a plan view showing how a shaft portion of a metal member according to a third embodiment has been inserted into the through hole of the printed circuit board.
Figure 12:
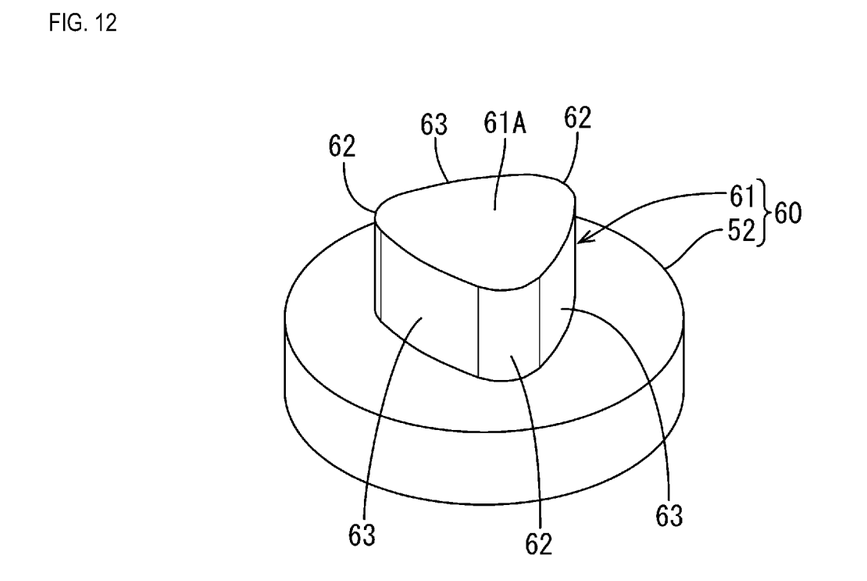
FIG. 12 is a perspective view showing the metal member.
Figure 13:
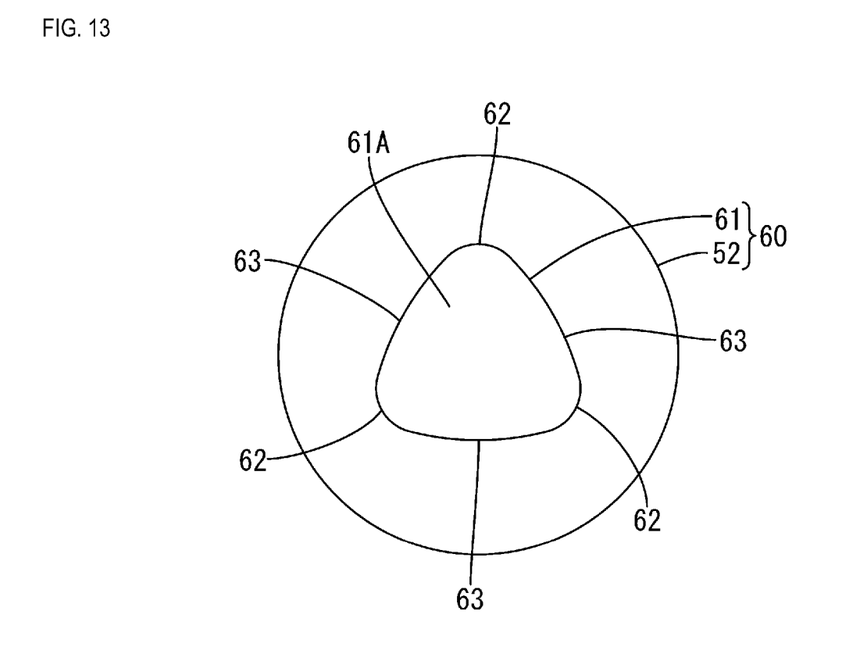
FIG. 13 is a plan view showing the metal member.
Figure 14:
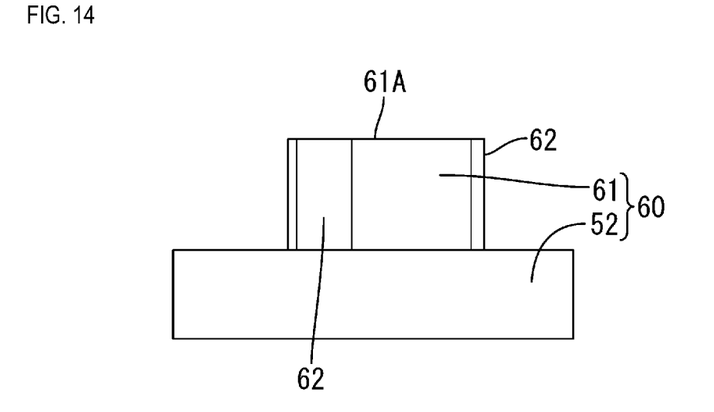
FIG. 14 is a side view showing the metal member.

As shown in FIGS. 12 and 13, the flat cross-section of the shaft portion 61 of the metal member 60 is approximately shaped in a triangle, and an upper end face 61A of the shaft portion 61 is level with the conductive path 24 in the upper face of the printed circuit board 22. The outer circumference of the shaft portion 61 includes tapered press-fitting portions 62 for press-fitting into the hole wall of the through hole 25, and non-press-fitting portions 63 that are arranged opposed to the hole wall of the through hole 25 and that are not press-fitted into the hole wall of the through hole 25. As shown in FIG. 11, gaps G3 in which the bonding material 35 is filled are formed between the non-press-fitting portions 63 and the hole wall of the through hole 25, and by the gaps G3 being filled with the bonding material 35, the metal member 60 and the printed circuit board 22 are bonded to each other.

According to the third embodiment, due to the press-fitting portions 62 being press-fitted into the hole wall of the through hole 25, the metal member 60 can be temporarily locked on the hole wall of the through hole 25, and thus the work for bonding with the bonding material 35 can be readily performed, and manufacturing costs can be reduced. Furthermore, due to the non-press-fitting portions 63 being provided, high dimensional accuracy is not required compared to a configuration in which the whole outer circumferential surface of the shaft portion 61 is press-fitted into the hole wall of the through hole 25, and manufacturing costs can be reduced.

Fourth Embodiment

Here, a fourth embodiment will be described with reference to FIGS. 15 and 16. Whereas in the above embodiments the heat dissipation member 40 is laid under the printed circuit board 22, in an electrical junction box 70 of the fourth embodiment, the heat dissipation member 40 is not laid under the metal member-equipped circuit board 21, and the metal member-equipped circuit board 21 is housed in a case 80 in a state of being supported from below by a supporting member 71. The supporting member 71 is a frame made of a synthetic resin or metal, and includes a mounting portion 72 on which the circumferential edge portion of the printed circuit board 22 is mounted, and an engaged portion 73 that protrudes toward the case 80 and is engaged in the case 80. The case 80 is made of metal or a synthetic resin and includes an upper case 81 and a lower case 82, and an engaging portion 84 into which the engaged portion 73 is to be inserted and engaged penetrates through the case 80.

Fifth Embodiment

Figure 17:
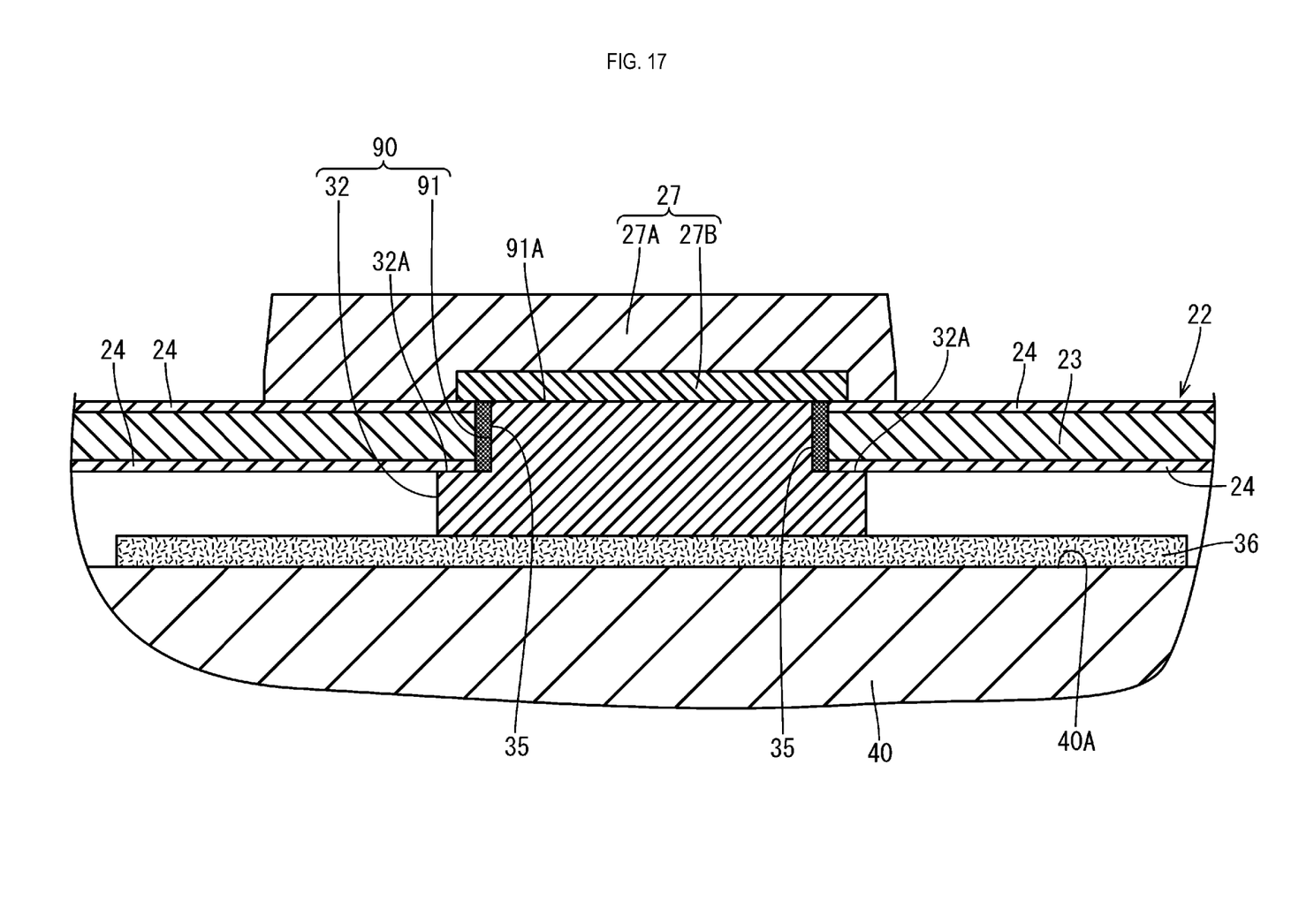
FIG. 17 is a partial enlarged cross-sectional view of an electrical junction box according to a fifth embodiment, corresponding to FIG. 2.
Figure 18:
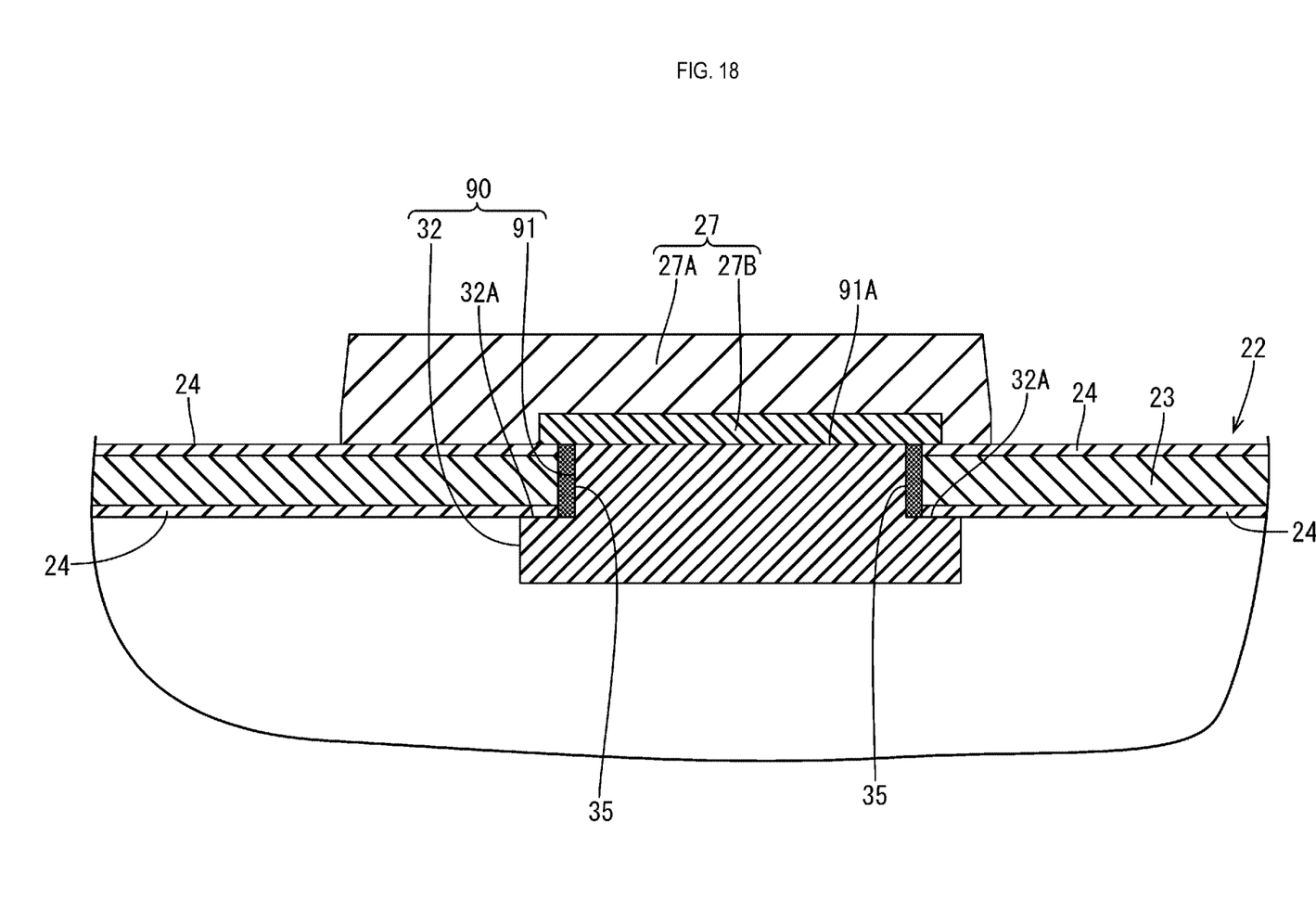
FIG. 18 is a partial enlarged cross-sectional view of the electrical junction box according to the fifth embodiment, corresponding to FIG. 16.

Here, a fifth embodiment will be described with reference to FIGS. 17 and 18. Whereas in the first to third embodiments the gap G2 that is filled with the bonding material 35 is formed between the printed circuit board 22 and the head portion 32, a shaft portion 91 of a metal member 90 shown in FIGS. 17 and 18 is shorter than the shaft portion 31 of the first to third embodiments, and the upper face 32A of the head portion 32 is in contact with the conductive path 24 on the lower face of the printed circuit board 22. Other structural aspects are the same as in the above embodiments, and therefore the same structures as in the above embodiments are denoted with the same reference signs, and the description thereof is omitted.

Other Embodiments

The teaching disclosed in the present specification is not limited to the above embodiments described using the foregoing description and drawings, and embodiments such as the following are also encompassed in the technical scope of the teaching disclosed in the present specification.

(1) Although in the electric component 27 of the above embodiments the terminals 27B are arranged on the bottom face of the main body 27A, there is no limitation to this. A configuration is also possible in which, for example, the terminals 27B protrude from the side or the like of the main body 27A and are soldered to the conductive path 24 of the printed circuit board 22, the metal member 30, or the like.

(2) Although in the above embodiments the head portion 32 of the metal members 30, 50, and 60 is shaped like a plate, there is no limitation to this. A configuration is also possible in which the metal members 30, 50, and 60 include a head portion having a semispherical or spherical shape, for example. Furthermore, a configuration is also possible in which the head portion has a protruding shape which partially protrudes, or a recessing shape which partially recesses.

(3) Although in the third embodiment the shaft portion 31 of the metal member 60 has a cross section which is approximately shaped in a triangle, there is no limitation to this. A configuration is also possible in which the cross section of the shaft portion 31 is shaped in a polygon other than a triangle, and the corners of the polygon are the press-fitting portions that are fitted into the hole wall of the through hole 25. A configuration is also possible in which the cross section of the shaft portion is shaped in an oval, an ellipse, or the like that has long and short diameters, and the diameter varies in accordance with the position in the circumferential direction.

Figure 15:
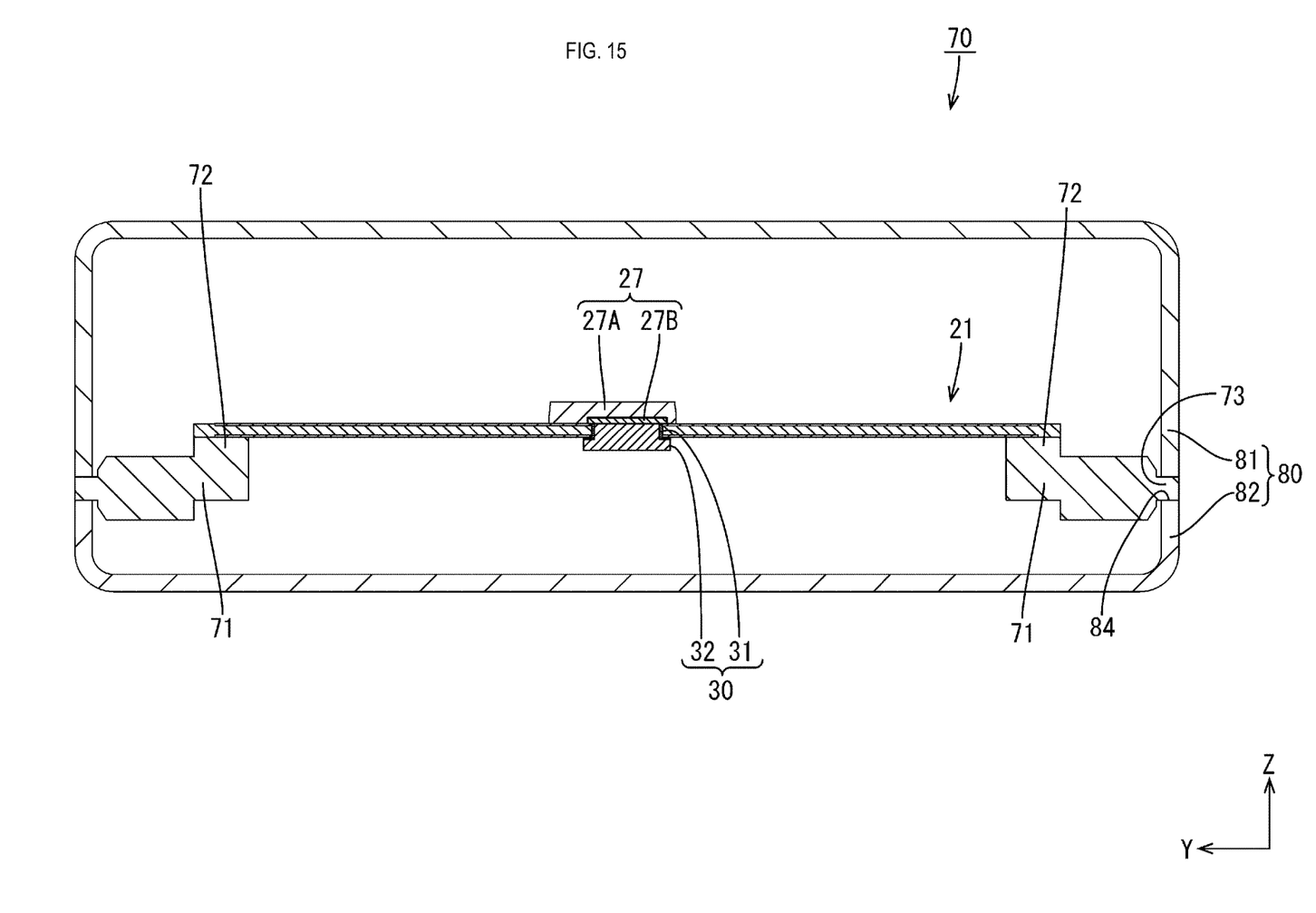
FIG. 15 is a cross-sectional view showing an electrical junction box according to a fourth embodiment.
Figure 16:
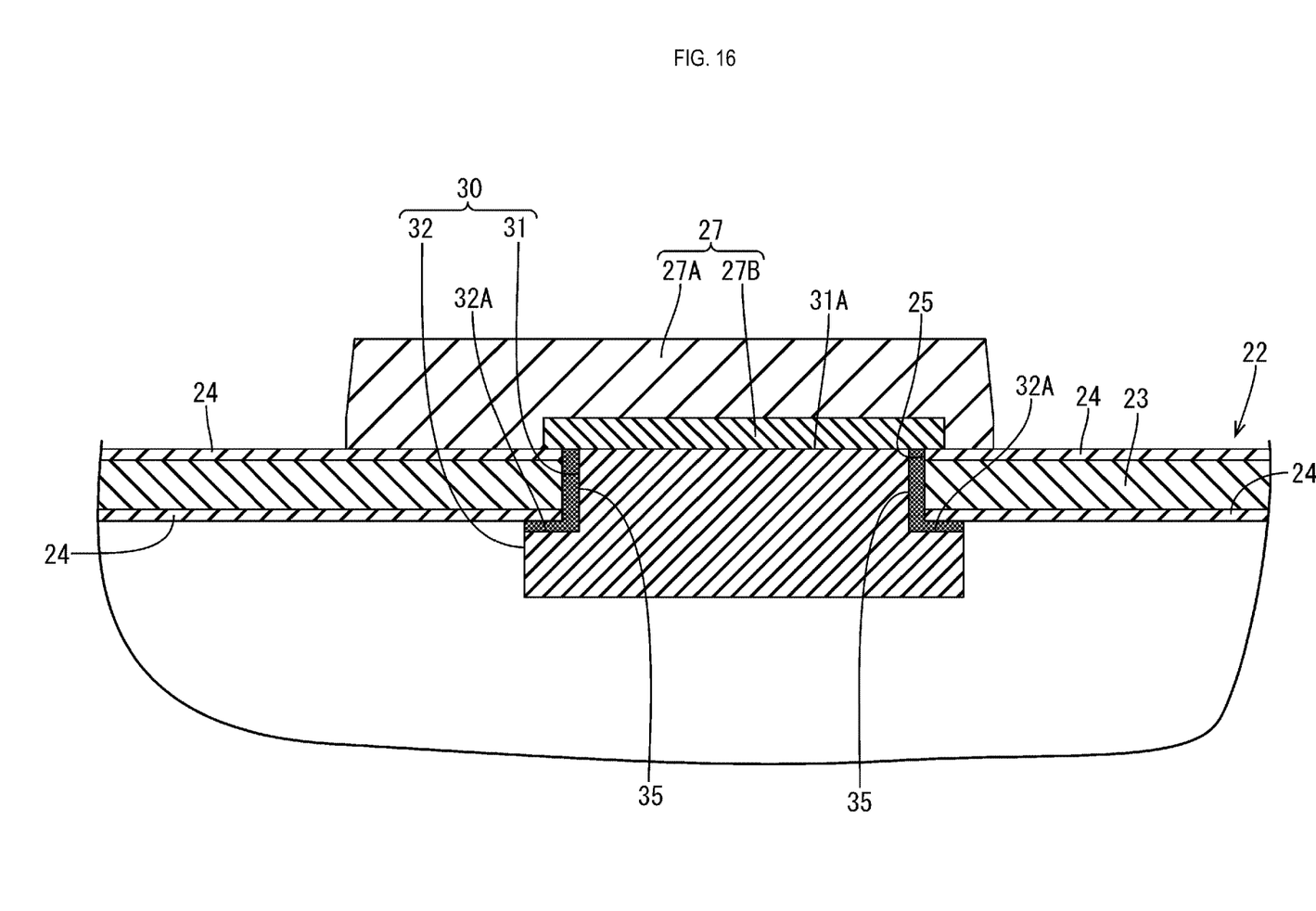
FIG. 16 is a partial enlarged view of FIG. 15.

(4) Although one electric component 27 and one metal member 30 are shown in FIGS. 1 and 15, the number of the electric component 27 and the metal member 30 is not limited to the number as in the above embodiments, and a plurality of these components and members can also be provided in accordance with the conductive paths 24 and the like.

(5) Although the metal member 30 is described as a rivet, there is no limitation to this. The metal member 30 may also be a screw in which a thread portion is formed in the shaft portion, for example.

(6) Although the bonding material 35 is described as a solder, there is no limitation to this. The bonding material 35 may also be a material such as a brazing filler material or a conductive adhesive agent (conductive resin), for example. Furthermore, it is also possible that the metal member 30 is temporarily fixed to the printed circuit board 22 (e.g., the upper face 32A of the head portion is fixed to the printed circuit board 22 with an adhesive agent), and thereafter, the metal member 30 is bonded to the printed circuit board 22 with the bonding material.

LIST OF REFERENCE NUMERALS 10, 70 Electrical junction box
11, 80 Case
20 Circuit assembly
21 Metal member-equipped circuit board
22 Printed circuit board
23 Insulative plate
24 Conductive path
25 Through hole
27 Electric component
30, 50, 60 Metal member
30 Metal member
31, 61 Shaft portion
31A End face
32, 52 Head portion
32A, 52A Upper face
35 Bonding material
36 Heat dissipation grease
40 Heat dissipation member
42 Spacer portion
62 Press-fitting portion
63 Non-press-fitting portion
A1 Diameter of through hole
B1 Diameter of shaft portion
B2 Diameter of head portion
B3 Diameter of head portion
G1, G2, G3 Gap

The invention claimed is:

1. A metal member-equipped circuit board comprising:
a printed circuit board including a through hole;
a metal member including a shaft portion that is inserted into the through hole, and a head portion that is arranged outside the through hole, the head portion having a diameter larger than a diameter of the through hole; and
a solder that joins the printed circuit board and the head portion of the metal member to each other,
wherein a diameter of the shaft portion of the metal member is smaller than the diameter of the through hole,
the through hole has a rectangular shape,
a cross section of the shaft portion of the metal member has a rectangular shape, and
the head portion of the metal member has a prismatic shape;
an electric component including a main body and a terminal and a terminal formed on a bottom face of the main body, wherein a lower face of the terminal and the lower face of the main body are planar, the terminal disposed on a top surface of the printed circuit board and covering the through hole; and
wherein in a state where the shaft portion is inserted into the through hole, an end face of the shaft portion on an opposite side to the head portion is formed at the same height as a surface of a conductive path to which a terminal of an electric component of the printed circuit board is connected so as to be coplanar with the surface of the conductive path.

2. The metal member-equipped circuit board according to claim 1,
wherein a gap formed between the shaft portion of the metal member and an inner wall of the through hole is filled with the solder.

3. A circuit assembly comprising:
the metal member-equipped circuit board according to claim 1;
a heat dissipation member placed on the metal member-equipped circuit board, and
a heat conductive material that is arranged between the head portion of the metal member and the heat dissipation member, and is in intimate contact with both the head portion of the metal member and the heat dissipation member.

4. The circuit assembly according to claim 3, wherein a gap formed between the shaft portion of the metal member and an inner wall of the through hole is filled with the solder.

5. The circuit assembly according to claim 3,
wherein the heat dissipation member is integrally provided with a spacer portion that maintains an interval between the printed circuit board and the heat dissipation member.

6. An electrical junction box comprising:
the metal member-equipped circuit board according to 3, and
a case that covers the metal member-equipped circuit board.

7. The electrical junction box according to claim 6, wherein a gap formed between the shaft portion of the metal member and an inner wall of the through hole is filled with the solder.

\* \* \* \* \*